(12) United States Patent
Lin

(10) Patent No.: US 12,331,999 B2
(45) Date of Patent: Jun. 17, 2025

(54) THERMAL MODULE

(71) Applicant: ASIA VITAL COMPONENTS CO., LTD., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 181 days.

(21) Appl. No.: 18/196,410

(22) Filed: May 11, 2023

(65) Prior Publication Data

US 2024/0093946 A1 Mar. 21, 2024

(30) Foreign Application Priority Data

Sep. 16, 2022 (TW) .................................. 111135217

(51) Int. Cl.
*F28D 15/02* (2006.01)
*F28F 1/32* (2006.01)

(52) U.S. Cl.
CPC .......... *F28D 15/0275* (2013.01); *F28F 1/325* (2013.01); *F28F 2215/08* (2013.01); *F28F 2225/06* (2013.01)

(58) Field of Classification Search
CPC .... F28F 1/325; F28F 2215/08; F28F 2225/06; F28D 15/0275
USPC .................................................. 165/104.21
See application file for complete search history.

(56) References Cited

U.S. PATENT DOCUMENTS

| 8,079,406 | B2   | 12/2011 | Hung et al. |
| 8,453,716 | B2   | 6/2013  | Hsieh et al. |
| 11,143,460 | B2 * | 10/2021 | Lin ......................... F28D 15/04 |
| 11,725,883 | B2 * | 8/2023  | Tochigi ................. H01L 23/427 |
|            |      |         | 165/104.21 |

(Continued)

FOREIGN PATENT DOCUMENTS

| TW | 201728866 A | 8/2017 |
| TW | M627850 U | 6/2022 |
| TW | M635528 U | 12/2022 |

OTHER PUBLICATIONS

Search Report dated Mar. 30, 2023 issued by Taiwan Intellectual Property Office for counterpart application No. 111135217.

(Continued)

*Primary Examiner* — Claire E Rojohn, III
(74) *Attorney, Agent, or Firm* — Bradley J. Thorson; DeWitt LLP

(57) ABSTRACT

A thermal module includes a radiating fin unit having a plurality of superposed radiating fin assemblies, and a plurality of groups of heat pipes. The heat pipes respectively have a heat absorbing section and a heat dissipating section formed at two opposite ends thereof. The heat absorbing sections in each heat pipe group is in contact with a heat source, and the heat dissipating sections in the same heat pipe group is sandwiched between two adjacent ones of the radiating fin assemblies. The thermal module is characterized in that the heat dissipating sections are horizontally extended through the radiating fin assemblies from one of two opposite shorter sides to another shorter side along two parallel longer sides thereof, such that the heat dissipating sections not only have a maximum contact area with the radiating fin assemblies, but also give the radiating fin unit an enhanced structural strength.

5 Claims, 4 Drawing Sheets

(56) References Cited

U.S. PATENT DOCUMENTS

| | | | | |
|---|---|---|---|---|
| 11,732,976 B1* | 8/2023 | Chen | .................... | F28D 15/0275 |
| | | | | 165/104.11 |
| 11,774,180 B2* | 10/2023 | Wang | .................. | F28D 15/0275 |
| | | | | 165/104.21 |
| 12,181,224 B2* | 12/2024 | Chang | ........................ | G06F 1/20 |
| 2005/0045310 A1* | 3/2005 | Okutsu | .................... | F28D 15/04 |
| | | | | 257/E23.099 |
| 2008/0123298 A1* | 5/2008 | Takeguchi | .............. | G06F 1/203 |
| | | | | 165/80.2 |
| 2008/0210404 A1* | 9/2008 | Peng | ...................... | H01L 23/427 |
| | | | | 165/80.3 |
| 2009/0109621 A1* | 4/2009 | Cheng | ................. | F28D 15/0233 |
| | | | | 361/697 |
| 2009/0168331 A1* | 7/2009 | Fujiwara | ................. | G06F 1/203 |
| | | | | 361/679.47 |
| 2010/0101763 A1 | 4/2010 | Huang et al. | | |
| 2010/0186930 A1* | 7/2010 | Lin | ....................... | H01L 23/427 |
| | | | | 165/104.26 |
| 2020/0355443 A1* | 11/2020 | Tochigi | ............... | F28D 15/0275 |

OTHER PUBLICATIONS

Search Report dated Apr. 16, 2024 issued by Taiwan Intellectual Property Office for counterpart application No. 1 111135217.

* cited by examiner

THERMAL MODULE

This application claims the priority benefit of Taiwan patent application number 111135217 filed on Sep. 16, 2022.

FIELD OF THE INVENTION

The present invention relates to the field of heat dissipation, and more particularly, to a thermal module.

BACKGROUND OF THE INVENTION

Please refer to FIGS. 1A and 1B, in which a conventional heat dissipation device is shown. The conventional heat dissipation device includes a first heat pipe group 91, a second heat pipe group 92, and a heat sink 93. The heat sink 93 includes a first radiating fin group 931, a second radiating fin group 932 and a third radiating fin group 933, which are superposed sequentially from top to bottom. More specifically, the first radiating fin group 931 is located above the second and the third radiating fin group 932, 933 and includes a first supporting member 9311 and a plurality of first radiating fins 9312 mounted on and connected to the first supporting member 9311.

The second radiating fin group 932 includes a plurality of second supporting members 9321 and a plurality of second radiating fins 9322 mounted on and connected to the second supporting members 9321. The second radiating fins 9322 are connected at their respective top and bottom to the second supporting members 9321 located above and below them.

The third radiating fin group 933 includes a third supporting member 9331 and a plurality of third radiating fins 9332 mounted on and connected to the third supporting member 9331. The third radiating fins 9332 are located below the second radiating fins 9322 and spaced from the latter by the third supporting member 9331.

The first radiating fin group 931 and the third radiating fin group 933 are respectively provided at a middle location of their one longer side with an upper notch 9314 and a lower notch 9334 in correspondence to the first heat pipe group 91 and the second heat pipe group 92, respectively.

The first and the second heat pipe group 91, 92 include four pieces of first heat pipes 911 and four pieces of second heat pipes 921, respectively. Each of the first heat pipes 911 has an evaporating section 9111 and a condensing section 9112 located at two opposite ends of the first heat pipe 911; and each of the second heat pipes 921 have an evaporating section 9211 and a condensing section 9212 located at two opposite ends of the second heat pipe 921. The evaporating sections 9111 are connected to a water block 94A in contact with a heat source, and the evaporating sections 9211 are connected to another water block 94B in contact with another heat source. The condensing sections 9112 are correspondingly extended into the upper notch 9314, and the condensing sections 9212 are correspondingly extended into the lower notch 9334. As can be seen in FIG. 1A, the left two pieces of the first heat pipes 911 and the right two pieces of the first heat pipes 911 are connected to the first supporting member 9311 and are bent to extend leftward and rightward, respectively, in the first radiating fin group 931. Similarly, the left two pieces of the second heat pipes 921 and the right two pieces of the second heat pipes 921 are connected to the third supporting member 9331 and are bent to extend leftward and rightward, respectively, in the third radiating fin group 933. With these arrangements, the conventional heat dissipation device can uniformly cool two heat sources that produce different amounts of heat. However, as can be seen in FIG. 1B, two bent portions 9113 on the left two pieces of the first heat pipes 911 and two bent portions 9113 on the right two pieces of the first heat pipes 911 are bent at specific curvatures, such that the bent portions 9113 on the first heat pipes 911 are horizontally spaced from one another without being closely arrayed side by side. As a result, a relatively large space 913 is left between the left two bent portions 9113 and the right two bent portions 9113, and a space 914 is also formed between the left two bent portions 9113 and between the right two bent portions 9113 in the first radiating fin group 931. The spaces 913, 914 as indicated by gray color in FIG. 1B together form a completely unused waste area, within which no first heat pipe 911 is in contact with the surface of the first radiating fin group 931 to provide the effect of heat exchange. In other words, the first radiating fins 9312 and the first supporting member 9311 are not in full contact with the condensing sections 9112 of the first heat pipes 911, resulting in decreased contact area between the first radiating fins 9312 and the condensing sections 9112 of the first heat pipes 911. Similarly, the left two pieces of the second heat pipes 921 and the right two pieces of the second heat pipes 921 are bent in the lower notch 9334 at specific curvatures to become horizontally spaced without being closely arrayed side by side. Therefore, the same unused waste area formed by spaces 913, 914 also exists in the third radiating fin group 933. These problems prevent the third radiating fins 9332 and the third supporting member 9331 from fully contacting with the condensing sections 9212 of the second heat pipes 921 to result in decreased contact area between the third radiating fins 9332 and the second heat pipes 921. Since the radiating fin groups 931, 932, 933 include many unused heat transfer areas, the conventional heat dissipation device has relatively lower overall heat transferring efficiency.

Further, all the bent portions of the first and the second heat pipes 911, 921 are adiabatic sections located in the upper and the lower notch 9314, 9334, respectively, to together define an inactive heat transfer zone X, which is enclosed by dashed lines as shown in FIG. 1B. In the inactive heat transfer zone X, the bent portions do not provide any heat transfer effect. Therefore, only the condensing sections 9112, 9212 of the first and the second heat pipes 911, 921, respectively, located at two laterally outer sides of the inactive heat transfer zone X have the function of transferring heat to the first and the third radiating fin group 931, 933 for dissipation. Since the condensing sections 9112, 9212 of the first and the second heat pipes 911, 921 respectively cover only about one-third of a full length of the radiating fin groups 931, 933, which results in insufficient heat transfer distance and insufficient heat transfer contact area on the heat sink 93 and accordingly, poor heat dissipating effect of the conventional heat dissipation device.

Further, the upper and the lower notch 9314, 9334 on the first and the third radiating fin group 931, 933, respectively, have an opening size that needs to be expanded when the number of the first and the second heat pipes 911, 921 are respectively increased to, for example, six or more. In this case, the inactive heat transfer zone X will increase with the increased area of the bent portions of the heat pipes 911, 921 in the upper and the lower notch 9314, 9334. The increased inactive heat transfer zone X also reduces the contact areas between the condensing sections 9112, 9212 of the first and the second heat pipes 911, 921 with the radiating fin groups 931, 932, 933. Another problem is the provision of the upper and the lower notch 9314, 9334 on the first and the third radiating fin group 931, 933 inevitably results in reduced structural strength of the whole heat sink 93. Therefore, the first, second and third radiating fin groups 931, 932, 933 must be structurally reinforced using the first, second and third supporting members 9311, 9321, 9331. The additional supporting members not only increase the manufacturing cost and overall weight of the conventional heat dissipation device, but also increase the thermal resistance between the heat pipes and the radiating fin groups because the heat carried by the heat pipe groups is transferred indirectly to the radiating fin groups. These problems also result in poor heat transfer efficiency and reduced heat dissipation efficiency.

For the ends of the first and the second heat pipe groups 91, 92 that form the condensing sections 9112, 9212 to extend into a central position in the first and the third radiating fin group 931, 933, it is necessary to sacrifice and remove the central heat dissipating areas of the first and the third radiating fin group 931, 933 to form the upper and the lower notch 9314, 9334. This not only increases the manufacturing procedures of the conventional heat dissipation device, but also reduces the overall heat dissipating areas thereof. With the upper and the lower notch 9314, 9334 formed at the central positions of the first and the third radiating fin group 931, 933, the first and the second heat pipe group 91, 92 must be vertically aligned with each other. Therefore, the water blocks 94A, 94B connected to the evaporating sections 9111, 9211 of the first and the second heat pipe group 91, 92 must be arranged linearly to align with each other in an axial direction of the heat pipes 911, 921. However, when the conventional heat dissipation device is to be mounted in an electronic product having limited internal space, such as a computer or a server, the water blocks 94A, 94B might be hindered by the densely distributed electronic elements in the electronic device and could not be mounted in the above manner.

It is therefore tried by the inventor to develop an improved thermal module to overcome the problems in the conventional heat dissipation device, including increased manufacturing cost due to the additional supporting members, reduced heat dissipating areas, increased overall weight, and unsuitable for use with electronic products with limited internal space.

SUMMARY OF THE INVENTION

A primary object of the present invention is to provide an improved thermal module that includes heat pipe groups respectively having a heat dissipating section, which is completely extended through and sandwiched between two adjacent radiating fin assemblies to not only enable effective function of heat exchange, but also give the radiating fin assemblies an enhanced structural strength.

Another object of the present invention is to provide a thermal module that does not require additional supporting members and therefore has largely reduced manufacturing cost and overall weight.

To achieve the above and other objects, the thermal module according to the present invention includes a radiating fin unit and a plurality of groups of heat pipes. The radiating fin unit includes a plurality of radiating fin assemblies, which are superposed with a space left between any two adjacent ones of them. Each radiating fin assembly includes a plurality of radiating fins, which are horizontally sequentially fastened to one another to provide at least one complete contact surface. Each of the heat pipes includes a heat absorbing section and a heat dissipating section formed at two opposite ends thereof. The heat absorbing sections of the heat pipes in each group are in contact with a heat source, and the heat dissipating sections of the heat pipes in the same group is sandwiched between two adjacent ones of the radiating fin assemblies. The thermal module of the present invention is characterized in that the heat dissipating sections of the heat pipes in each group are respectively horizontally extended from one of two opposite shorter sides to another shorter side of one radiating fin assembly along two parallel longer sides thereof, such that the heat dissipating sections are in full contact with the radiating fin assemblies to not only have a maximum contact area with the radiating fin assemblies but also give the latter an enhanced structural strength. Since the conventional metal supporting members made of such as iron for fixing radiating fins of radiating fin assemblies in place are omitted from the present invention, the thermal module of the present invention can have effectively reduced manufacturing cost and overall weight compared to the prior art heat dissipation device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
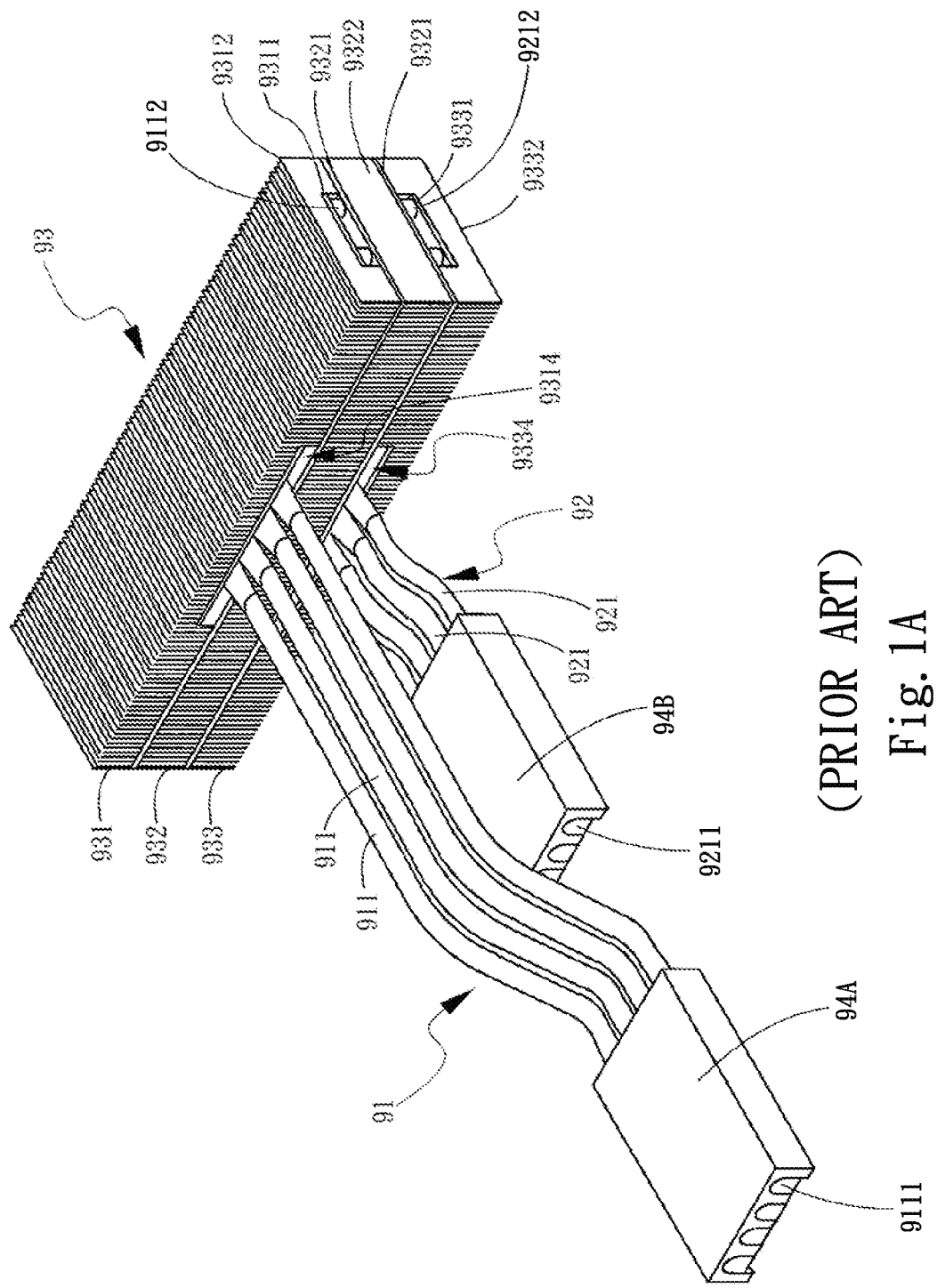
FIG. 1A is a perspective view of a conventional heat dissipation device.
Figure 1B:
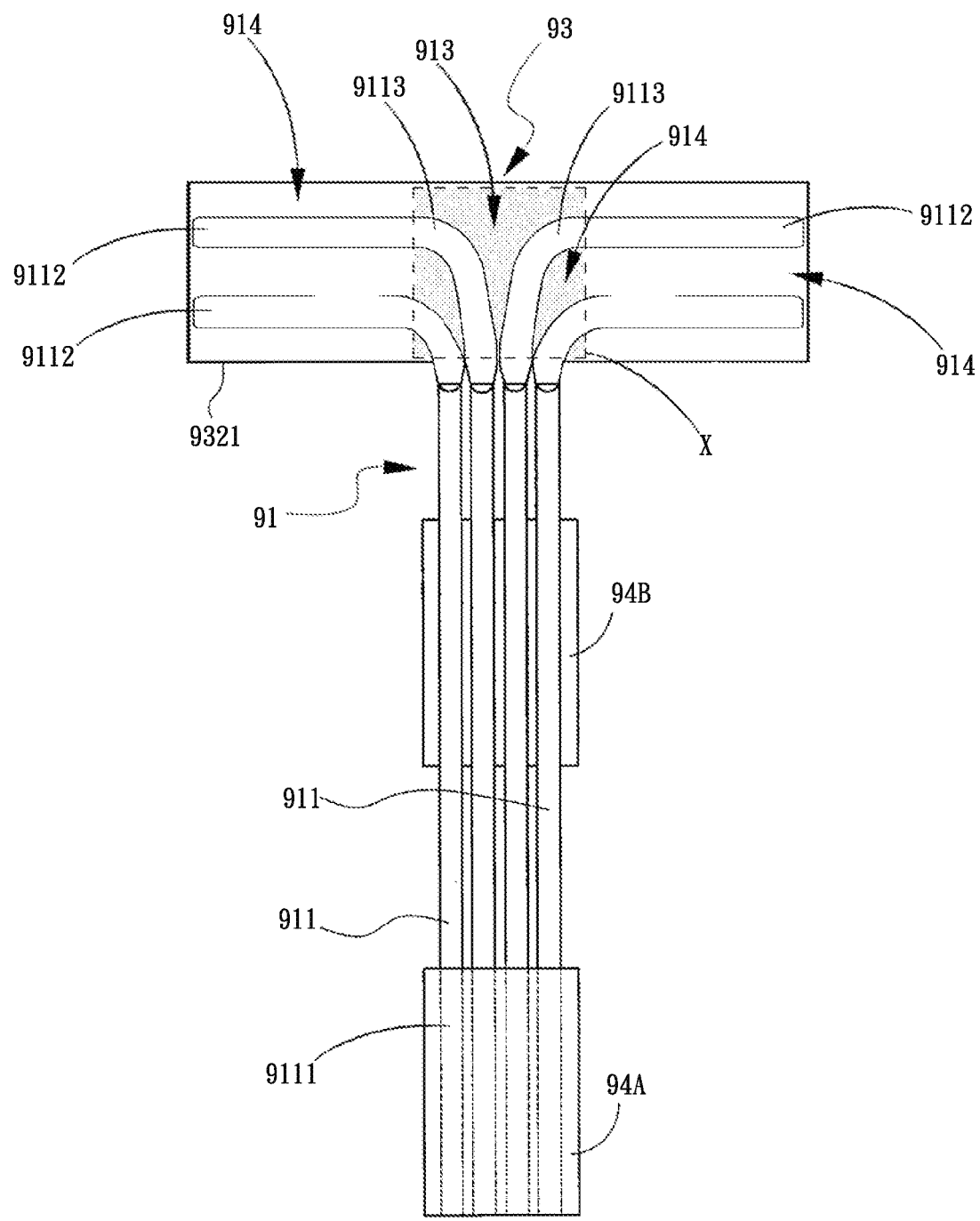
FIG. 1B is a top view of the conventional heat dissipation device of FIG. 1A with part of its radiating fins removed therefrom.

The present invention will now be described with a preferred embodiment thereof. For the purpose of easy to understand, elements that are the same in the preferred embodiment are denoted by the same reference numerals.

Figure 2A:
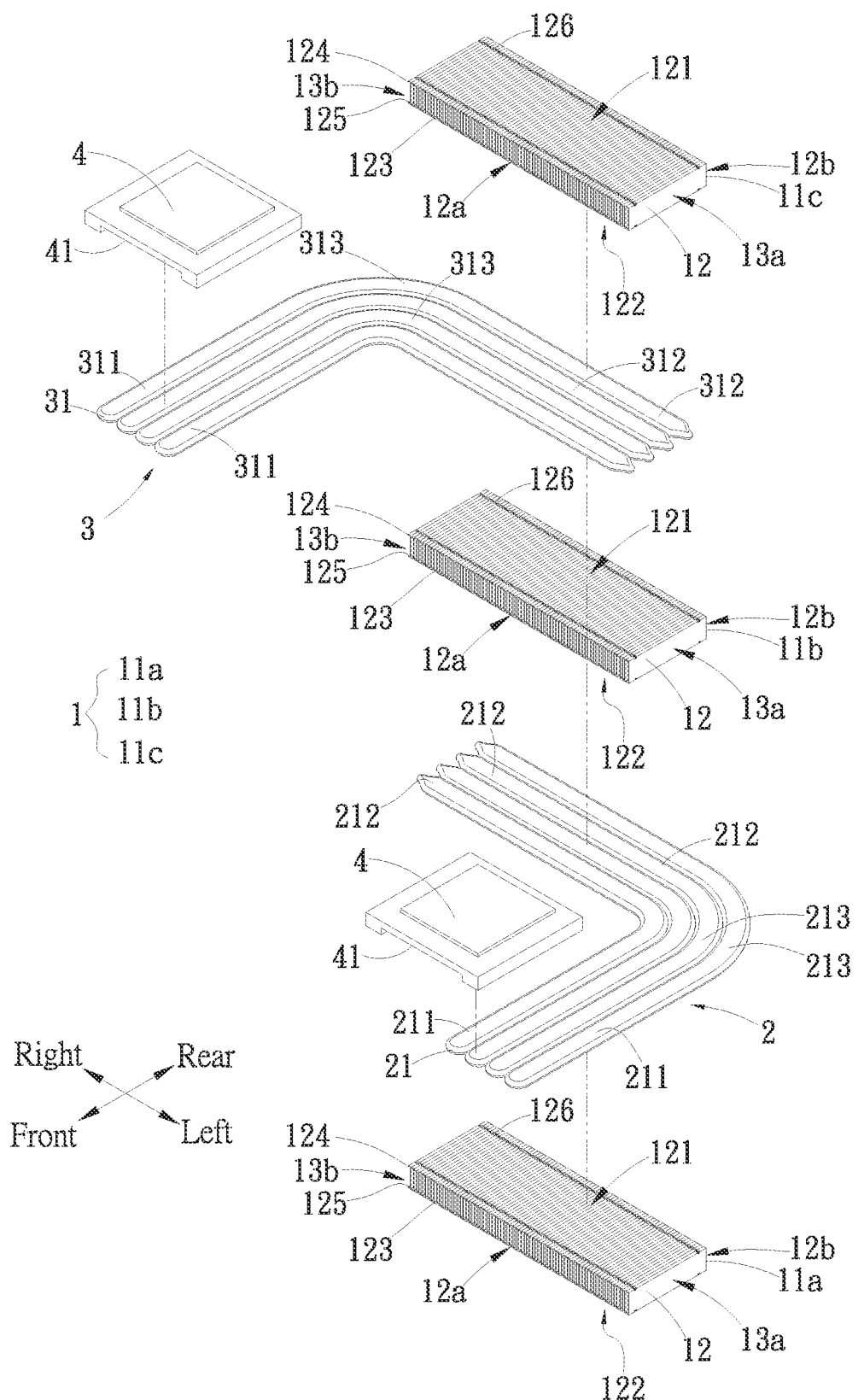
FIG. 2A is an exploded perspective view of a thermal module according to a preferred embodiment of the present invention.
Figure 2B:
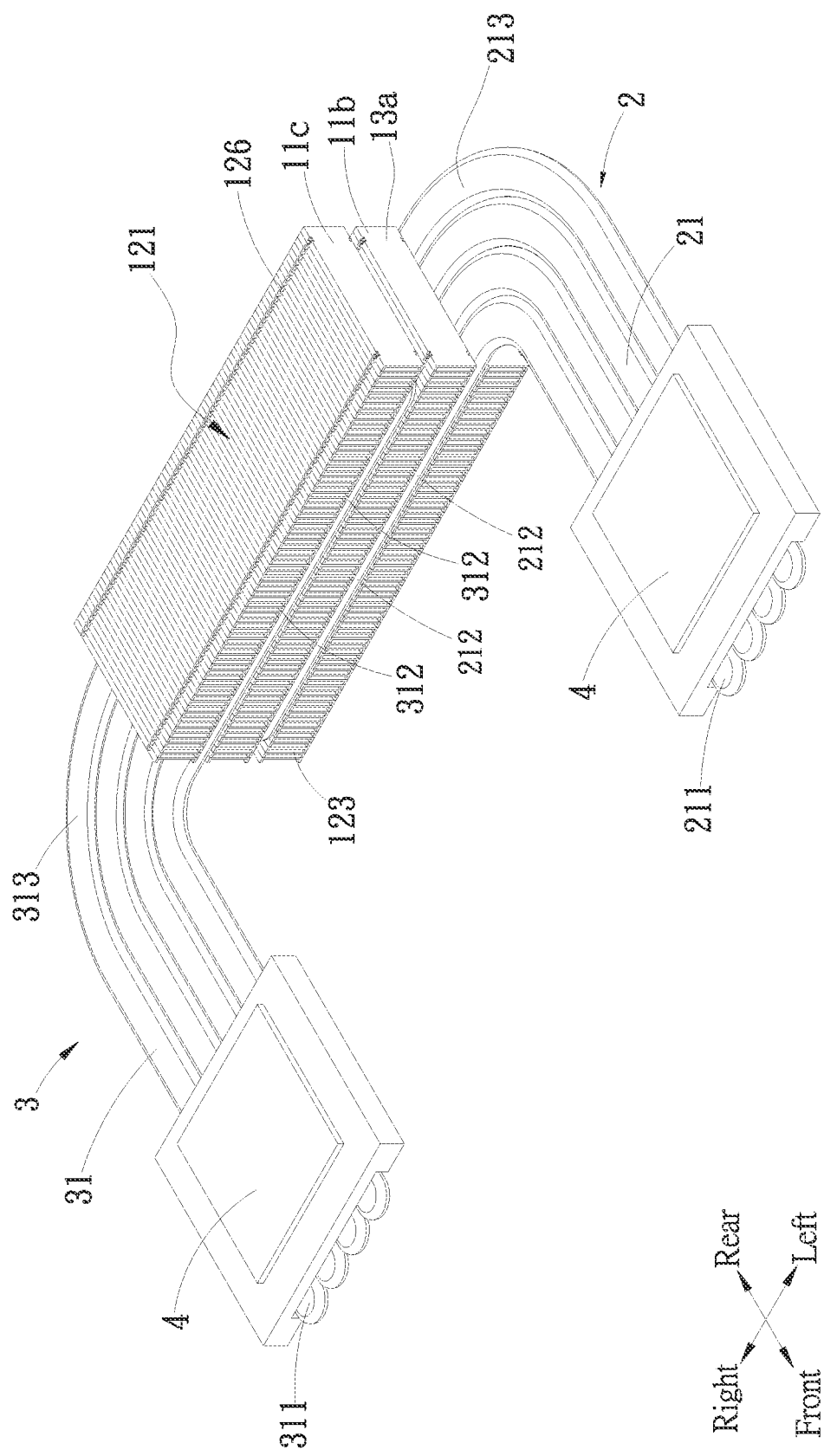
FIG. 2B is an assembled view of the thermal module of FIG. 2A.

Please refer to FIGS. 2A and 2B, which are exploded and assembled perspective views, respectively, of a thermal module according to a preferred embodiment of the present invention. As shown, the thermal module of the present invention includes a radiating fin unit 1 and a plurality of heat pipe groups.

The radiating fin unit 1 includes a plurality of radiating fin assemblies, which are superposed with a space left between any two adjacent ones of them. To facilitate easy description of the present invention, the illustrated preferred embodiment includes three radiating fin assemblies denoted by reference numerals 11a, 11b, 11c from bottom to top, namely, a bottom radiating fin assembly 11a, a middle radiating fin assembly 11b, and a top radiating fin assembly 11c. It is understood, however, in practical implementation of the present invention, the number of the radiating fin assemblies is not necessarily limited to three.

Each of the bottom, the middle and the top radiating fin assembly 11a, 11b, 11c is formed of a plurality of radiating fins 12 sequentially fastened to one another in a horizontal direction, such that a heat dissipation passage 123 is formed between any two adjacent radiating fins 12. In the illustrated preferred embodiment, every radiating fin 12 of the bottom, middle and top radiating fin assemblies 11a, 11b, 11c includes an upper flange 124 and a lower flange 125, which are laterally extended in the same direction to align with the upper and lower flanges 124, 125 on other radiating fins 12. The upper and the lower flange 124, 125 on each of the radiating fins 12 are respectively provided with a fastening section 126. In the illustrated preferred embodiment, the fastening section 126 is a snap-fit fastening structure. However, it is understood the fastening section 126 may be any other type of fastening means without being particularly limited to the above example.

Every radiating fin 12 on the bottom, middle and top radiating fin assemblies is connected to an adjacent radiating fin 12 by engaging their fastening sections 126 with one another horizontally, either by snap fit or lap joint, so as to form fastened radiating fin assemblies. All the upper flanges 124 of each radiating fin assembly 11a, 11b, 11c together form a top contact surface 121 that provides a heat transfer or contact area; and all the lower flanges 125 of each radiating fin assembly 11a, 11b, 11c together form a bottom contact surface 122 that also provides a heat transfer or contact area. Two opposite longer sides of each radiating fin assembly 11a, 11b, 11c located between and connected to the top and the bottom contact surface 121, 122 are defined as a front longer side 12a and a rear longer side 12b, respectively, and two opposite shorter sides of each radiating fin assembly 11a, 11b, 11c located between and connected to the front longer side 12a and the rear longer side 12b are defined as a left shorter side 13a and a right shorter side 13b, respectively, as indicated by the coordinates in FIGS. 2A and 2B.

As shown in FIG. 2A, to facilitate easy description of the present invention, there are two groups of heat pipes shown in the preferred embodiment, namely, a lower layer heat pipe group 2 and an upper layer heat pipe group 3. However, it is understood, in practical implementation of the present invention, the number of the heat pipe groups is not necessarily limited thereto.

The lower and upper layer heat pipe groups 2, 3 respectively include a plurality of parallelly arranged heat pipes 21, 31. Each of the heat pipes 21, 31 includes a heat absorbing section 211, 311; a heat dissipating section 212, 312; and a bent heat transferring section 213, 313. The heat absorbing sections 211 of the heat pipes 21 in the lower layer heat pipe group 2 and the heat absorbing sections 311 of the heat pipes 31 in the upper layer heat pipe group 3 are respectively in direct or indirect contact with a different heat source (not shown); and the bent heat transferring section 213, 313 of each heat pipe 21, 31 in the lower and upper layer heat pipe groups 2, 3, respectively, is located between and connected to the corresponding heat absorbing section 211, 311 and the heat dissipating section 212, 312 and is located outside the radiating fin assemblies 11a, 11b, 11c. The bent heat transferring sections 213 of the lower layer heat pipes 21 and the bent heat transferring sections 313 of the upper layer heat pipes 31 can be selectively located corresponding to the same shorter side or two different shorter sides of the radiating fin assemblies 11a, 11b, 11c. For example, the bent heat transferring sections 213 of the lower layer heat pipes 21 and the bent heat transferring sections 313 of the upper layer heat pipes 31 can be located corresponding to the left shorter side 13a of the bottom radiating fin assembly 11a and the right shorter side 13b of the top radiating fin assembly 11c, respectively, as shown in the preferred embodiment. Or, alternatively, the bent heat transferring sections 213 of the lower layer heat pipes 21 and the bent heat transferring sections 313 of the upper layer heat pipes 31 can be selectively located corresponding to the same shorter side of the bottom and the top radiating fin assembly 11a, 11c.

Please refer to FIGS. 2A and 2B. The heat dissipating sections 212, 312 of the heat pipes 21, 31 in different layer heat pipe groups are respectively sandwiched between two adjacent radiating fin assemblies. That is, the heat dissipating sections 212 of the heat pipes 21 in the lower layer heat pipe group 2 are sandwiched between the bottom and the middle radiating fin assembly 11a, 11b; and the heat dissipating sections 312 of the heat pipes 31 in the upper layer heat pipe group 3 are sandwiched between the top and the middle radiating fin assembly 11c, 11b. More specifically, in the illustrated preferred embodiment, the heat dissipating sections 212 of the heat pipes 21 in the lower layer heat pipe group 2 are horizontally extended through between the bottom and the middle radiating fin assembly 11a, 11b from an outer side of the left shorter side 13a in the same direction as the front and rear longer sides 12a, 12b to the right shorter side 13b of the bottom and middle radiating fin assemblies 11a, 11b; and the heat dissipating sections 312 of the heat pipe 31 in the upper layer heat pipe group 3 are horizontally extended through between the top and the middle radiating fin assembly 11c, 11b from an outer side of the right shorter side 13b in the same direction as the front and rear longer sides 12a, 12b to the left shorter side 13a of the top and middle radiating fin assemblies 11c, 11b. Therefore, the heat dissipating sections 312 and the heat dissipating sections 212 are extended parallel to one another to be located perpendicularly to the heat dissipation passages 123 of the radiating fin assemblies 11a, 11b, 11c. With these arrangements, the heat dissipating sections 212, 312 of the heat pipes 21, 31 in the lower and the upper layer of heat pipe group 2, 3, respectively, are closely arrayed side by side to fully contact with the entire top contact surface 121 of the bottom radiating fin assembly 11a and the entire bottom contact surface 122 of the top radiating fin assembly 11c, respectively. Meanwhile, the lower and upper layer heat pipe groups 2, 3 also give the radiating fin assemblies 11a, 11b, 11c an enhanced structural strength.

Please refer to FIG. 2B. To hold the heat absorbing sections 211, 311 of the lower and upper layer heat pipe groups 2, 3 in place to fully contact with corresponding heat sources, a base 4 is provided between the heat sources and the heat absorbing sections 211, 311 of the heat pipes 21, 31 in the lower and the upper layer of heat pipe group 2, 3.

As can be seen in FIG. 2A, the base 4 has an upper side and a lower side, and a plurality of connecting sections 41 provided on the upper side or the lower side, or between the upper and the lower side of the base 4. In the illustrated preferred embodiment, the connecting sections 41 are respectively a recess formed on the lower side of the base 4 corresponding to the heat absorbing sections 211, 311, such that the heat absorbing sections 211, 311 of the heat pipes 21, 31 in the lower and the upper layer of heat pipe group 2, 3, respectively, are in direct contact with the corresponding heat sources.

In the illustrated preferred embodiment, the bent heat transferring sections 213 of the lower layer heat pipes 21 and the bent heat transferring sections 313 of the upper layer heat pipes 31 are located outside the left and the right shorter side 13a, 13b of the bottom and the top radiating fin assembly 11a, 11c, respectively. However, it is understood that, in other embodiments, the bent heat transferring sections 213 and the bent heat transferring sections 313 can be otherwise located outside the same left or right shorter side 13a, 13b of the bottom and the top radiating fin assembly 11a, 11c.

In the present invention, since the heat dissipating sections 212, 312 of the lower and the upper layer of heat pipe group 2, 3 are in full, close contact with the top contact surface 121 and/or the bottom contact surface 122 of the bottom, the middle and the top radiating fin assembly 11a, 11b, 11c, heat can be completely transferred from the heat pipes 21, 31 to the radiating fin assemblies 11a, 11b, 11c. Further, since the heat dissipating sections 212, 312 of the heat pipe groups 2, 3 are closely arrayed side by side and in full contact with the top and/or the bottom contact surfaces 121, 122, they also form a supporting structure of the radiating fin assemblies 11a, 11b, 11c to effectively increase the structural strength of the radiating fin unit 1. In addition, since the conventional metal supporting members made of such as iron for fixing the radiating fins in place are omitted from the radiating fin assemblies 11a, 11b, 11c of the present invention, it is able to achieve the effects of reduced manufacturing cost and overall weight of the radiating fin unit 1, and to overcome the problem of increased thermal resistance among the heat pipes and the radiating fins.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A thermal module, comprising:
   a radiating fin unit including radiating fin assemblies disposed in a stack, the radiating fin assemblies including a bottom radiating fin assembly, a top radiating fin assembly, and a middle radiating fin assembly, the middle radiating fin assembly being disposed between the bottom radiating fin assembly and the top radiating fin assembly, and each of the radiating fin assemblies being formed of a plurality of radiating fins sequentially fastened to one another in a horizontal direction to provide at least one contact surface thereon; and
   a plurality of groups of heat pipes including a first group of heat pipes and a second group of heat pipes, each of the heat pipes including a heat absorbing section and a heat dissipating section formed at two ends thereof, the heat dissipating section of the first group of heat pipes being disposed between the bottom radiating fin assembly and the middle radiating fin assembly, and the heat dissipating section of the second group of heat pipes being disposed between the middle radiating fin assembly and the top radiating fin assembly, the heat absorbing sections of the heat pipes in each of the heat pipe groups being in contact with a heat source; and
   the thermal module being characterized in that the heat dissipating sections of the heat pipes in each group are respectively horizontally extended from an outer side of one of two opposite shorter sides of one radiating fin assembly in the same direction as two opposite longer sides of the radiating fin assembly to another shorter side thereof, such that the heat dissipating sections are in full contact with the contact surfaces of corresponding radiating fin assemblies.

2. The thermal module as claimed in claim 1, wherein the heat pipes in each of the heat pipe groups further respectively include a bent heat transferring section, which is located between and connected to the heat absorbing section and the heat dissipating section of the same heat pipe; and the bent heat transferring sections of the heat pipes in different heat pipe groups being located outside the radiating fin assemblies corresponding to different shorter sides thereof.

3. The thermal module as claimed in claim 1, wherein any two adjacent radiating fins on each of the radiating fin assemblies define a heat dissipation passage between them, and the heat dissipation passages of the radiating fin assemblies being located perpendicularly to the heat dissipating sections of the heat pipe groups.

4. The thermal module as claimed in claim 1, wherein every radiating fin on the radiating fin assemblies includes an upper flange and a lower flange; and the radiating fins in each of the radiating fin assemblies being sequentially horizontally connected at the upper and the lower flanges to provide a top contact surface and a bottom contact surface, respectively.

5. The thermal module as claimed in claim 1, further comprising a base located between the heat absorbing sections of each heat pipe group and a heat source; wherein each of the bases includes a plurality of connecting sections, which are connected to the heat absorbing section of one corresponding heat pipe group and in direct contact with one corresponding heat source.

* * * * *